ROUTING PINS FOR WIRING APPARATUS

Filed June 13, 1969 3 Sheets-Sheet 1

United States Patent Office 3,608,190

Patented Sept. 28, 1971

3,608,190

ROUTING PINS FOR WIRING APPARATUS

James J. Steranko, Weston, and Arthur J. Guidi, Jr., Medway, Mass., assignors to Inforex, Inc., Waltham, Mass.

Filed June 13, 1969, Ser. No. 833,084
Int. Cl. B41m *3/08;* B23k *1/00*
U.S. Cl. 29—625 4 Claims

ABSTRACT OF THE DISCLOSURE

In the wiring of an electrical circuit on a circuit board having solder pads suitable for connection to circuit components, insulated wire passes through a solder head which is moved relative to the position of the board. A fixture has routing pins which protrude through holes in the circuit board so that the solder head can only move between rows of the routing pins. This prevents unintentionally bonding a wire to a pad.

BACKGROUND OF THE INVENTION

This invention relates to methods of and apparatus for wiring an electrical circuit on a circuit board and more particularly to positioning routing pins on the circuit board to prevent unintentional bonding of the wire to the pads.

State of the art wiring techniques include thermocompression bonding apparatus such as in the Helda et al. Pat. 3,400,448 and diffusion bonding of wires to electrical circuit boards such as shown in Zachry et al. Pat. 3,320,401.

Printed circuit techniques and/or the wire wrap process are generally used to wire a circuit on a circuit board. Copending application Ser. No. 812,022, filed Apr. 1, 1969, to James J. Steranko, discloses an alternative to the printed circuit processes and wire wrap processes for printed circuit boards. In this technique, insulated wire passes through a solder head which is moved relative to the position of the board. A portion of the wire extending from the head successively contacts the pad to which a wire connection is to be made. The application of heat to the pad with which the head is in contact reflow solders the wire to the pad.

SUMMARY OF THE INVENTION

In accordance with this invention, routing pins are positioned relative to the contacts on the board so that the solder head can move only between rows of the routing pins.

In practicing the invention of the aforementioned Steranko application, a previously affixed piece of wire may be lying on the pad at the time a connection is to be made to that pad. In this case, the first wire may be accidentally bonded to the pad at the same time that the intended connection is made. As a result, two nets of wires may be unintentionally shorted together. The present invention prevents the accidental bonding of a wire to a pad.

In one embodiment of the invention, routing pins are permanently mounted on a fixture. The fixture is mounted on a movable table. The circuit board is dropped over the pins so that the routing pins protrude through the board. The table is movable relative to the heads so that wires are routed between the pins. This prevents accidental bonding of a second wire not intended to be bonded to the pad at the same time as the bonding of the intended wire.

In one embodiment of the invention, the table is a manually movable table which has indents so that the table is movable in only two orthogonal directions. This insures that the wires will be routed in orthogonal lines between the routing pins.

In another embodiment of the invention, the table is automatically positioned by a positioning system. Multiple solder heads are provided to wire a plurality of boards at the same time.

The foregoing and other objects, features and advantages of the invention will be better understood from the following more detailed description, appended claims and drawings.

DESCRIPTION OF A PARTICULAR EMBODIMENT

Figure 1:
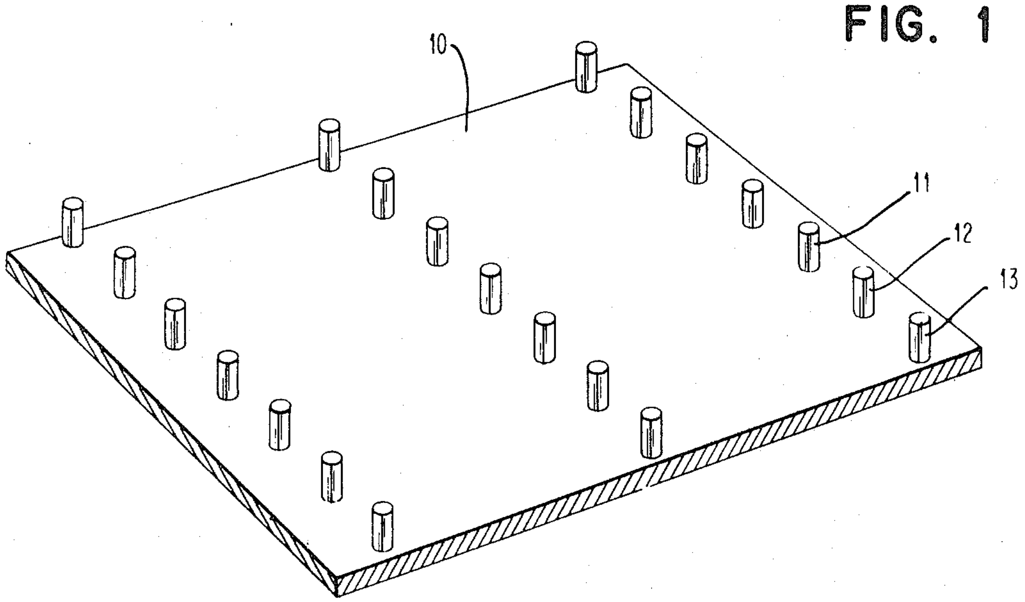
FIG. 1 shows a portion of the fixture with the routing pins mounted thereon.

Referring to FIG. 1, there is shown a fixture 10 having routing pins such as 11, 12 and 13 mounted thereon. A printed circuit board of the type shown in FIG. 2 can be dropped over the fixture so that the pins protrude through holes in the printed circuit board. Circuit boards of this type generally include a plurality of solder pads such as the pads 14, 15 and 16. These are connected by narrow electric connections to plated through via holes indicated at 17, 18 and 19. Circuit boards of this type have pads on the other side to which electrical components, sometimes referred to as flat packs, can be attached. The plated through via holes provide an electrical connection from the flat packs to the solder pads such as 14, 15 and 16.

In the wiring process of the aforementioned Steranko patent application, a solder head through which a continuous supply of insulated wire extends is moved from pad to pad on the circuit board. At each pad at which an electrical connection is made, the tip of the solder head is heated. The heat sublimates the insulation on the wire and reflow solders the wire to the pad. At the end of a net, a cutter is actuated to sever the wire. Then, another wire net is bonded to the specified pads. If the wiring is not carefully performed, a previously bonded wire may lie across a pad to which no connection has been made. Then, if a subsequent wire net is bonded to that pad, two nets may be accidentally shorted together.

Figure 2:
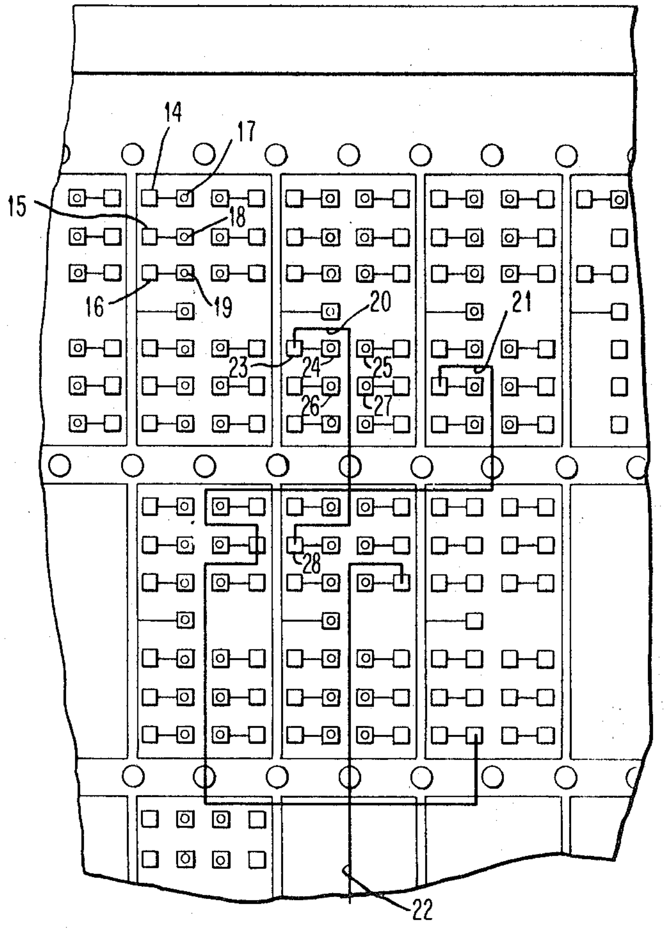
FIG. 2 shows a portion of a printed circuit board wired in accordance with this invention.

In order to prevent this, the routing pins on the fixture of FIG. 1 extend through the via holes of the board of FIG. 2. The fixture, with the board mounted thereon, is affixed to a table which is movable in only two orthogonal directions, for example, the two directions being shown as the vertical and horizontal directions in FIG. 2.

FIG. 2 shows the wires 20, 21 and 22 bonded to certain pads on the board. Consider the following example of operation in bonding these wires. The solder head is moved into contact with the pad 23. The tip is heated thereby sublimating the insulation on wire 20 and bonding it to the pad 23. The head is lifted. The table is moved relative to the head so that the head moves between the rows of routing pins extending through the via holes 24, 25, 26, 27 and so on until the head is moved into contact with the pad 28. At this point, the wire is severed thereby terminating this net. Then, another net such as that which includes the wire 21 is bonded to selected pads. Note that since the table is moved only in orthogonal directions and since the head is only moved between rows of routing pins, the wire never lies across a pad unless the wire is to be bonded to that pad. This prevents accidental bonding of a net to a pad.

Figure 3:
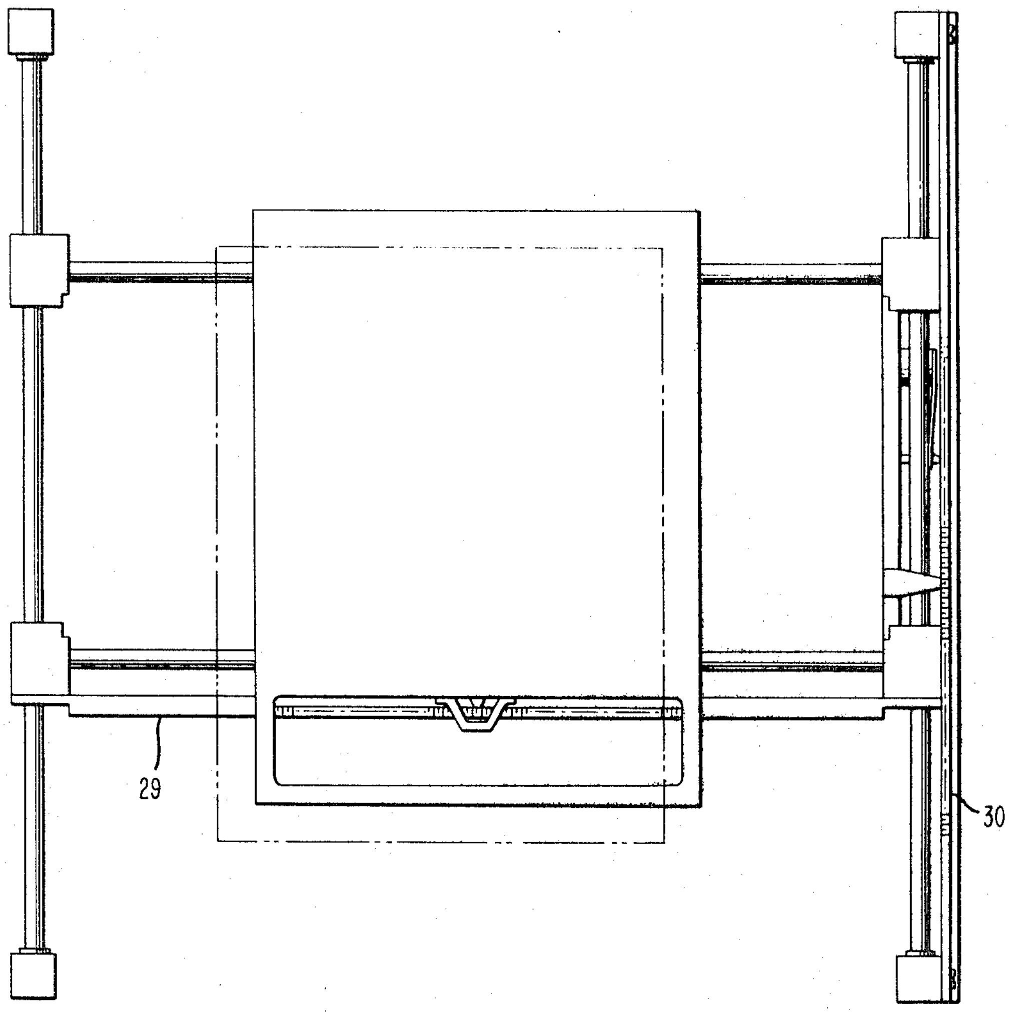
FIG. 3 shows a manually positioned table movable in only two horizontal directions beneath the solder head.

FIG. 3 shows a manually operated positioning table suitable for use in carrying out the present invention. The table includes detents 29 and 30 which can be actuated singly but which cannot be both actuated. That is, only one detent can be actuated at a time to move the table in a direction corresponding to the vertical direction in FIG. 3. The other detent can thereafter be actuated to move the table in an orthogonal direction corresponding to the horizontal direction in FIG. 3.

Figure 4:
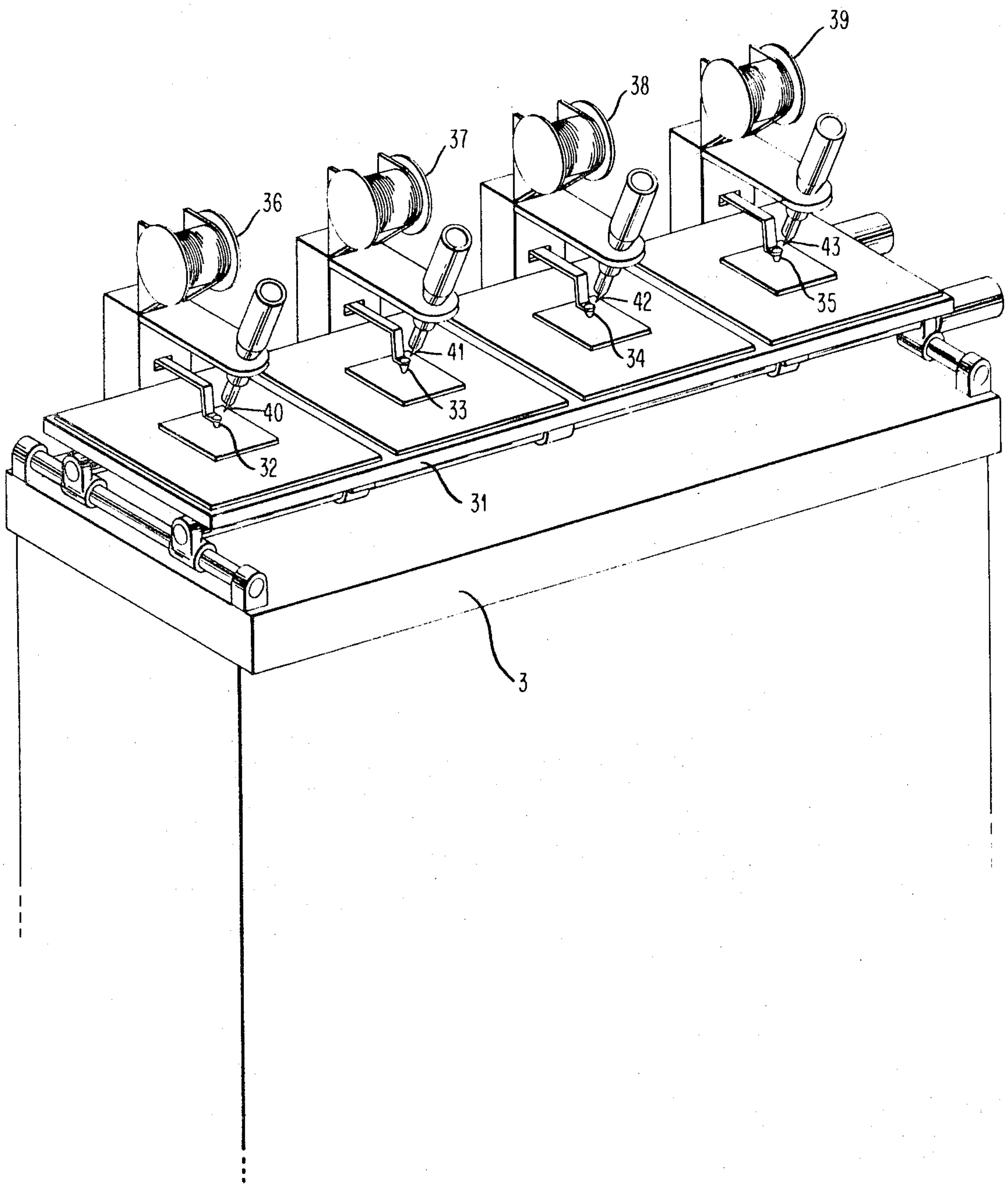
FIG. 4 shows an automatically positioned table together with four solder heads for simultaneously wiring four circuit boards.

Referring to FIG. 4, there is shown an automatically positioned table. The servo system for positioning the table 31 may be of the type commercially available as the Slo-Syn N/C positioning system manufactured by Superior Electric Company. This system controls the table from a paper tape to automatically position a point on the table beneath a head. Such a system may be programmed so that the table is movable in only two orthogonal directions.

Positioned above the table are four soldering heads 32–35. These are of the type in which a continuous supply of wire extends through an opening in the tip of the solder head. The head is movable vertically to bring the tip into contact with a pad to which the connection is made. When the tip is heated, the insulation on the portion of the wire extending from the opening in the head is sublimated. The pad is heated thereby reflow soldering the wire to the pad. The vertical movement of the solder heads is programmed to occur at the proper places in the sequence of table movements. In this manner, the entire wiring process is carried out automatically.

Several alternatives to the invention will be apparent. The routing pins can be picked up in a vacuum fixture, moved over the printed circuit board and dropped into the board. Wiring is then performed. Thereafter, the vacuum fixture moves back over the board, picks up the pins and positions them in the second board to be wired.

As another alternative, the flat packs could first be bonded to the printed circuit boards thereby allowing their pins to protrude through the via holes. The protruding pins will then perform the same function as the routing pins previously described.

While particular embodiments of the invention have been shown and described, various modifications may be made without departing from the true spirit and scope of the invention. The appended claims are, therefore, intended to cover any such modifications.

We claim:

1. The method of wiring an electrical circuit on a circuit board having contacts suitable for connection to circuit components comprising:

positioning routing pins relative to the contacts on said board, passing insulated wire through a head, moving the relative position of said head and said board only between rows of said routing pins so that a portion of the wire extending from said head successively bears only against contacts to which a wire connection is to be made, and applying heat to the contact which said head bears against to bond the portion of the wire extending from said head to said contact.

2. In apparatus for wiring an electrical circuit on a circuit board having solder pads suitable for connection to circuit components comprising:

a solder head in which heat is concentrated in the tip thereof and having an opening in said tip, a supply of insulated wire, said wire extending through said opening, a table, said table and said head being movable one with respect to the other so that said head can be aligned with a pad to which said wire is to be soldered, means producing relative movement between said head and said board so that said head contacts the pad to which said wire is to be soldered, and means for selectively applying heat to the pad with which said head is in contact to reflow solder the portion of the wire in contact with said pad, the improvement comprising:

a fixture having routing pins mounted thereon, said fixture being positioned on said table, said board being positioned on said fixture so that said routing pins extend through holes in said board, said table and said head being movable one with respect to the other so that said head moves only between rows of said routing pins whereby said wire bears only against contacts to which a connection is to be made.

3. The apparatus recited in claim 2 further comprising:

detents on said table so that said table is movable with respect to said head in only two directions, one orthogonal with respect to the other.

4. The apparatus recited in claim 2 wherein said table is movable with respect to said head by an automatic positioning system, and a plurality of solder heads mounted above said table so that a plurality of boards mounted on said table can be wired at the same time.

References Cited

UNITED STATES PATENTS

| | | | |
|---|---|---|---|
| 2,355,643 | 8/1944 | Grover | 29—203P |
| 2,987,804 | 6/1961 | Nichol | 29—407 |
| 3,197,844 | 8/1965 | Bassett | 29—407 |
| 3,216,101 | 11/1965 | Miller | 29—407 |
| 3,295,189 | 1/1967 | Hammell | 29—407 |
| 3,336,650 | 8/1967 | Bosler | 29—203MM |
| 3,372,455 | 3/1968 | Howie | 29—407 |
| 3,392,256 | 7/1968 | Bradham | 29—203B |
| 3,414,962 | 12/1968 | Altamura | 29—203J |
| 3,468,024 | 9/1969 | Yonkers | 29—407 |

JOHN F. CAMPBELL, Primary Examiner

D. P. ROONEY, Assistant Examiner

U.S. Cl. X.R.

29—471.1, 203B; 228—6, 7